United States Patent
Jandt et al.

(10) Patent No.: US 11,785,717 B2
(45) Date of Patent: Oct. 10, 2023

(54) CARD RETENTION CONNECTOR SYSTEM

(71) Applicant: International Business Machines Corporation, Armonk, NY (US)

(72) Inventors: Tyler Jandt, Rochester, MN (US); Mark Plucinski, Toms River, NJ (US); Sandra J. Shirk/Heath, Rochester, MN (US); Phillip V. Mann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 17/131,897

(22) Filed: Dec. 23, 2020

(65) Prior Publication Data

US 2022/0201859 A1 Jun. 23, 2022

(51) Int. Cl.
*H05K 1/14* (2006.01)
*H05K 5/02* (2006.01)
*H05K 5/00* (2006.01)

(52) U.S. Cl.
CPC ............. *H05K 1/14* (2013.01); *H05K 5/0069* (2013.01); *H05K 5/0291* (2013.01); *H05K 2201/049* (2013.01)

(58) Field of Classification Search
CPC ...... H05K 1/14; H05K 5/0069; H05K 5/0291; H05K 2201/049
USPC ................................................... 361/679.01
See application file for complete search history.

(56) References Cited

U.S. PATENT DOCUMENTS

| | | | |
|---|---|---|---|
| 4,095,866 A * | 6/1978 | Merrill | H05K 1/117 439/85 |
| 4,586,772 A | 5/1986 | Cobaugh | |
| 6,007,382 A | 12/1999 | Wu | |
| 6,179,664 B1 | 1/2001 | Tung | |
| 8,414,305 B2 | 4/2013 | Sun | |
| 9,385,453 B2 | 7/2016 | Yang | |
| 9,979,109 B2 | 5/2018 | Kelaher | |
| 2007/0291039 A1* | 12/2007 | Danilak | G06F 3/1438 345/501 |

(Continued)

FOREIGN PATENT DOCUMENTS

WO 0249164 A1 6/2002

OTHER PUBLICATIONS

List of IBM Patents or Patent Applications Treated as Related, Dec. 20, 2020, 2 pages.

(Continued)

*Primary Examiner* — Anatoly Vortman
*Assistant Examiner* — Zhengfu J Feng
(74) *Attorney, Agent, or Firm* — Grant McNeilly

(57) ABSTRACT

An electronic board assembly comprises a board comprising an electronic component and a connector mounted to the board and electrically connected to the electronic component. The connector is configured to receive an electronic card assembly, and the connector comprises an electrical contact and a friction contact. The electrical contact is configured to exert a first amount of force on the electronic card assembly when the electronic card assembly is being seated in the connector. The friction contact is configured to exert a second amount of force on the electronic card assembly when the electronic card assembly is being seated in the connector. The second amount of force is greater than the first amount of force.

19 Claims, 8 Drawing Sheets

(56) References Cited

U.S. PATENT DOCUMENTS

| | | | |
|---|---|---|---|
| 2013/0288534 A1* | 10/2013 | Degner | H01R 12/737 |
| | | | 29/874 |
| 2013/0330940 A1* | 12/2013 | Hasse | H01R 13/6586 |
| | | | 439/676 |
| 2014/0368988 A1* | 12/2014 | Tobias | G06F 1/20 |
| | | | 361/679.31 |
| 2017/0271818 A1* | 9/2017 | Lynch | H01R 12/737 |
| 2017/0294728 A1* | 10/2017 | Zuo | H01R 12/721 |

OTHER PUBLICATIONS

Jandt et al., "Card Retention Connector System," U.S. Appl. No. 17/131,924, filed Dec. 23, 2020.

\* cited by examiner

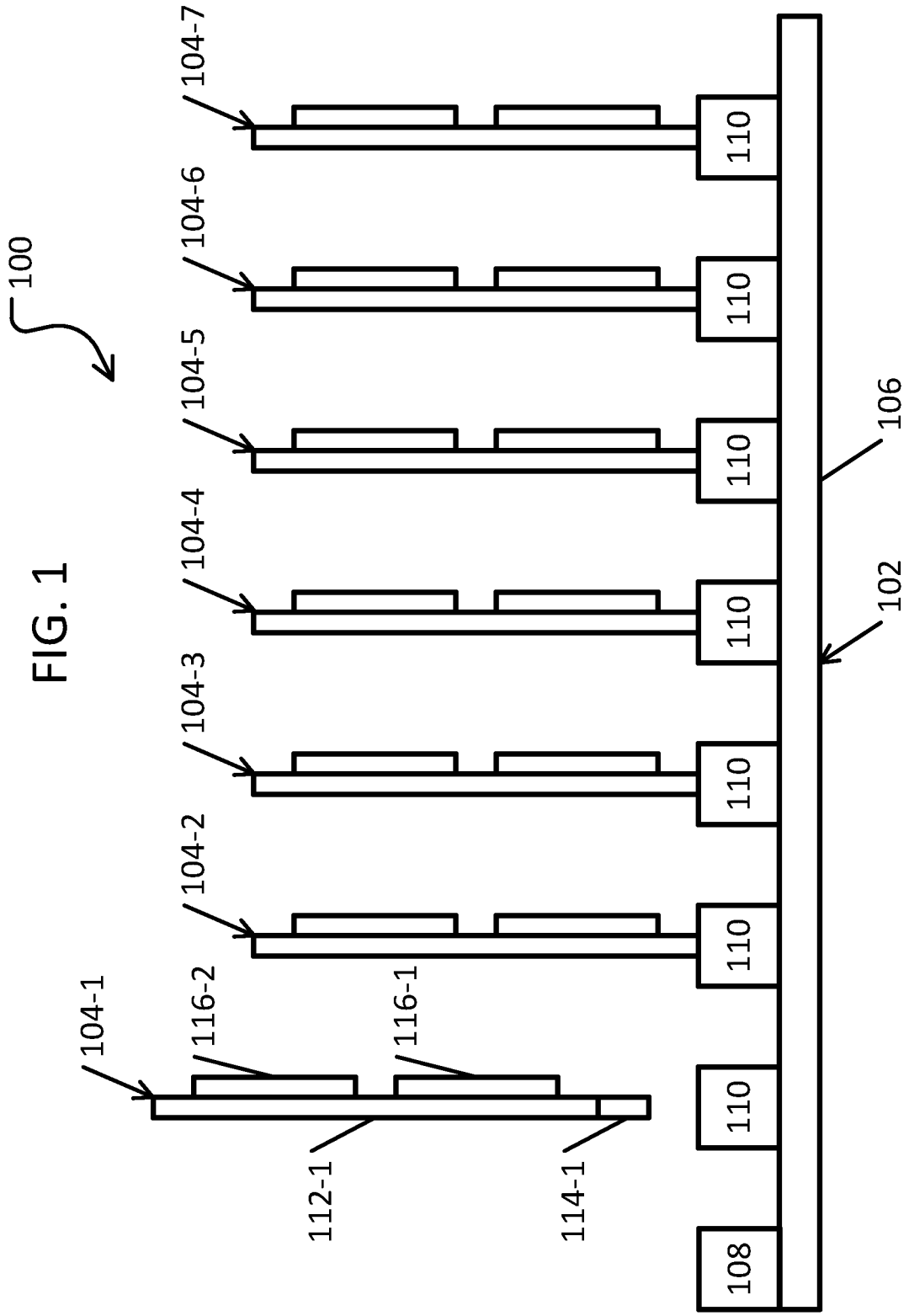

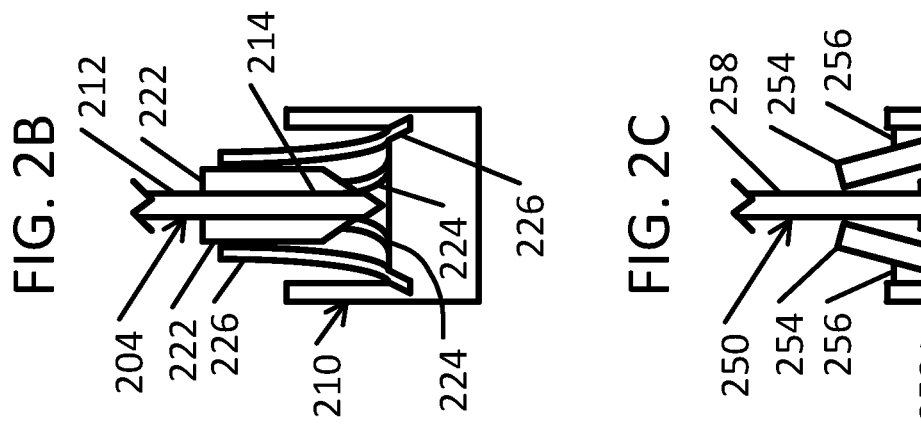
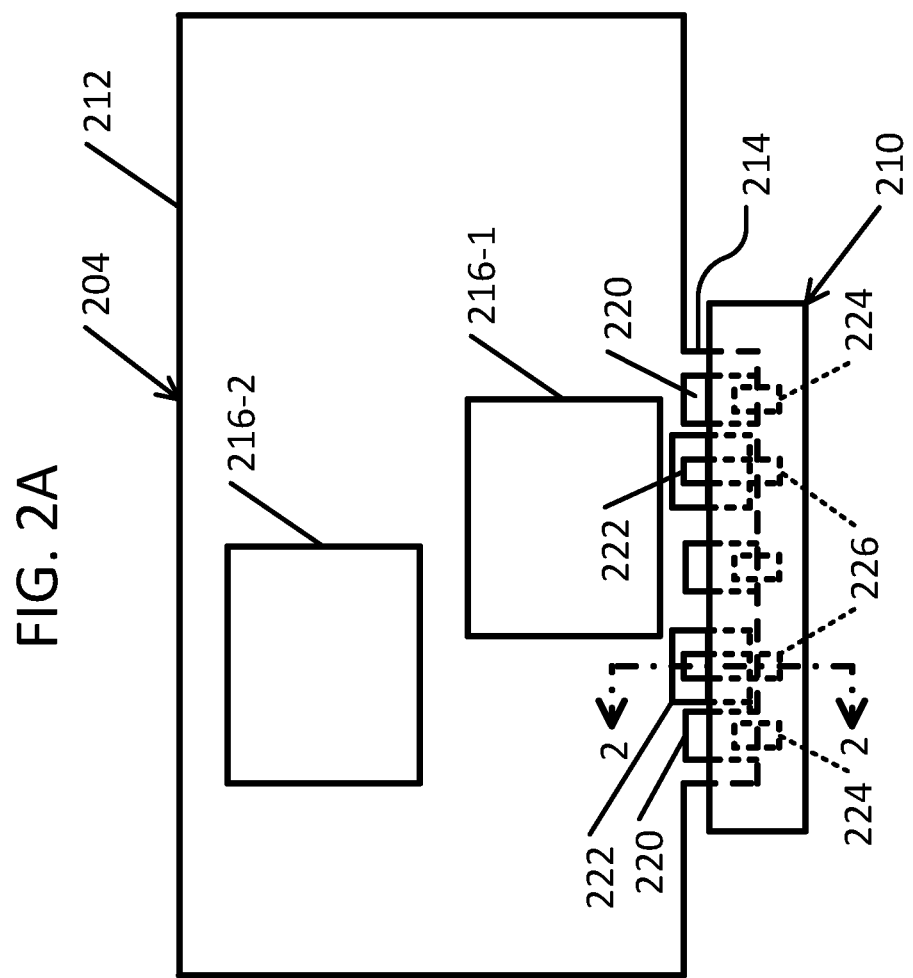

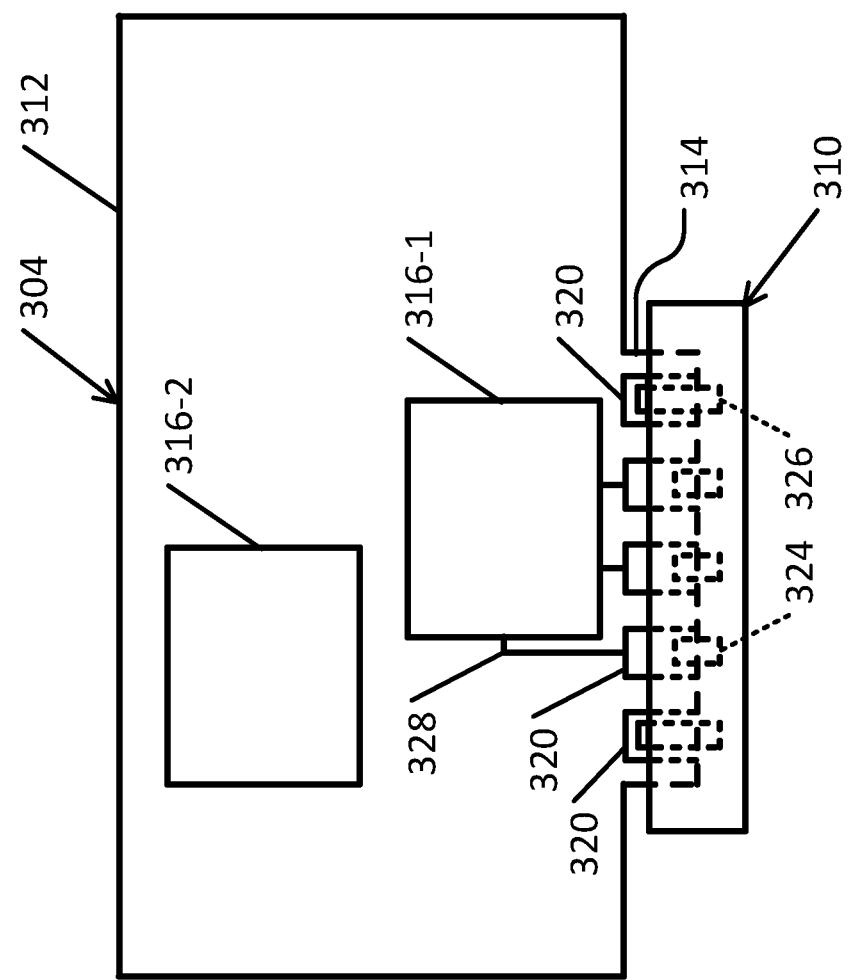

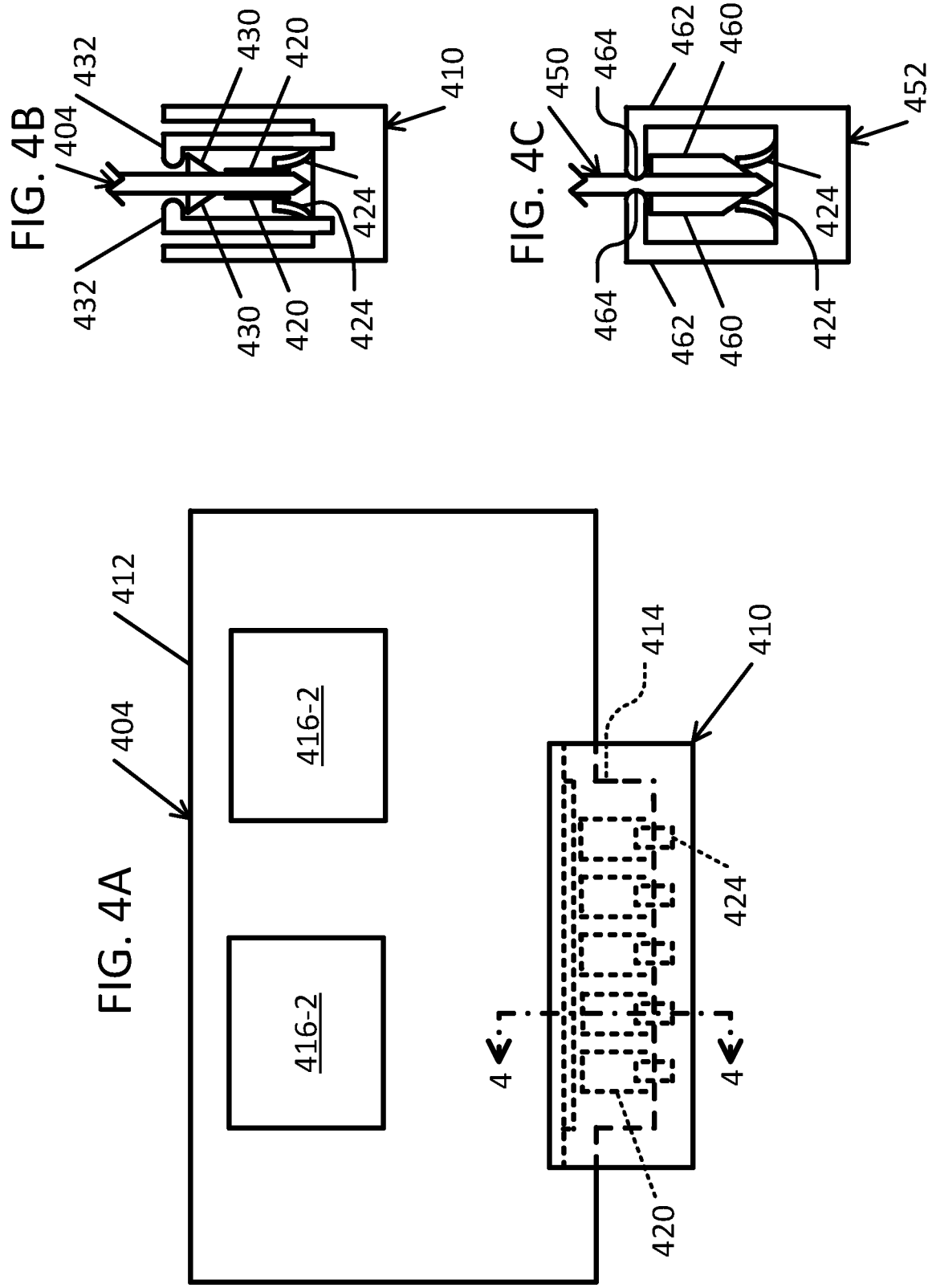

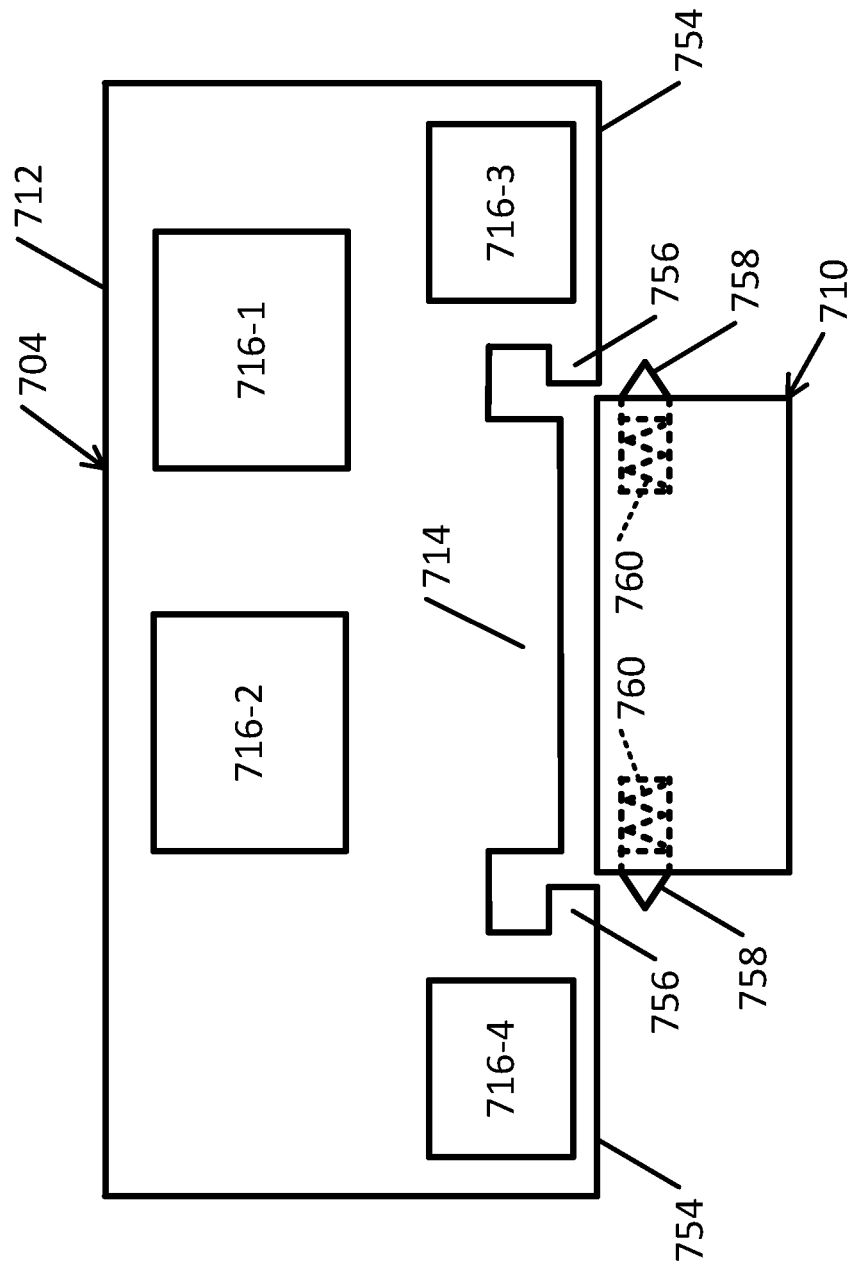

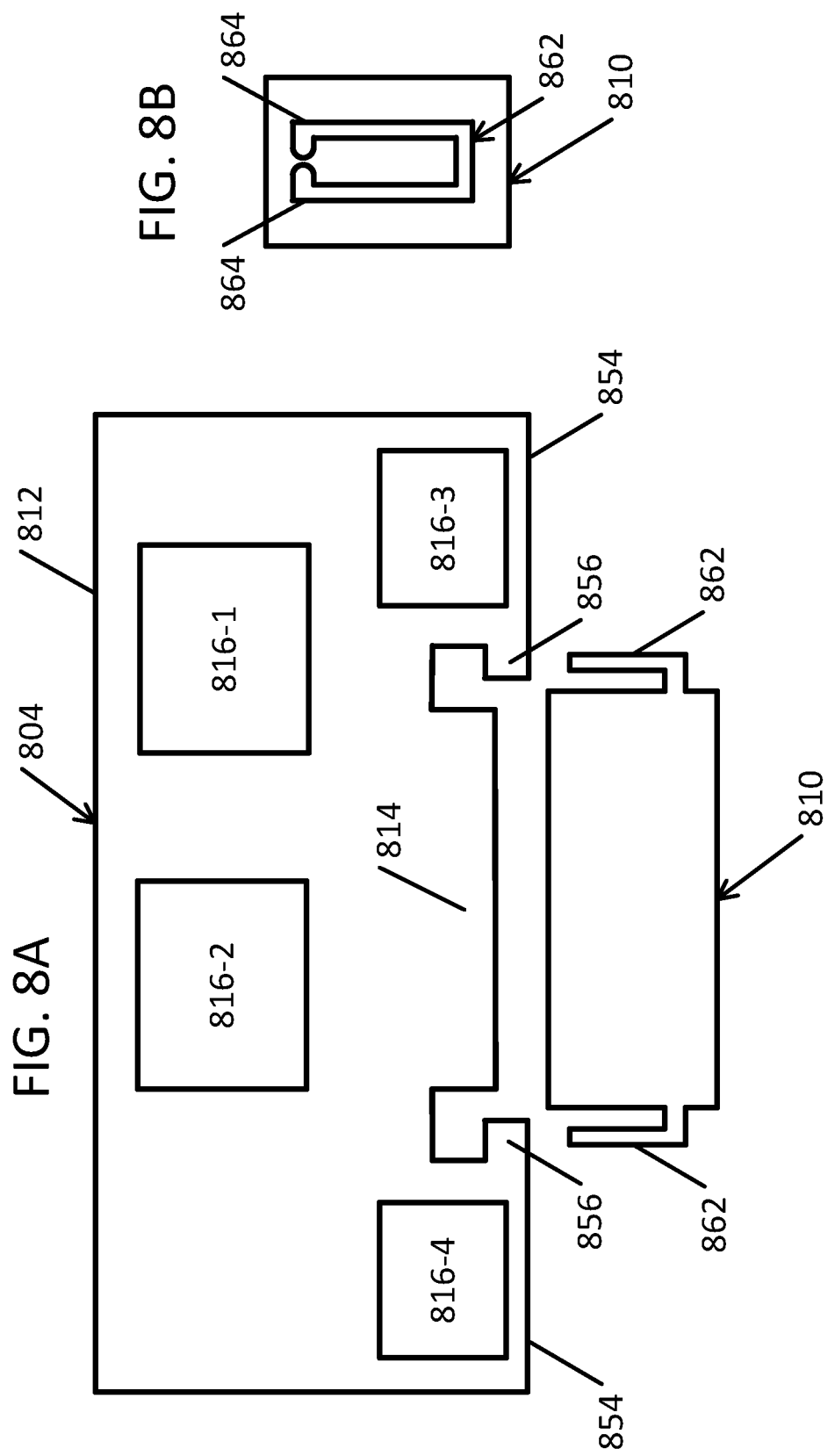

CARD RETENTION CONNECTOR SYSTEM

BACKGROUND

The present disclosure relates to electronic component assemblies, and more specifically, to electrical and mechanical connectors for printed circuit boards.

Traditional printed circuit boards (PCBs) can be employed in computing systems to perform computing functions. For example, a differential dual in-line memory module (DDIMM) can be connected to a backplane of a computer in order to provide memory functionality to the computer. Traditional PCBs have connectors that run along an entire edge of the PCB, which can limit the size of the PCB. In addition, traditional PCBs can have anchoring and/or securing features that can occupy space on the PCB. The result of either scenario can be that the capability and/or performance of the PCB can be limited. This can affect the capability and/or performance of the computer since there can be a limited number of slots for PCBs.

SUMMARY

According to an embodiment of the present disclosure, an electronic board assembly comprises a board comprising an electronic component and a connector mounted to the board and electrically connected to the electronic component. The connector is configured to receive an electronic card assembly, and the connector comprises an electrical contact and a friction contact. The electrical contact is configured to exert a first amount of force on the electronic card assembly when the electronic card assembly is being seated in the connector. The friction contact is configured to exert a second amount of force on the electronic card assembly when the electronic card assembly is being seated in the connector. The second amount of force is greater than the first amount of force.

According to an embodiment of the present disclosure, an electronic board assembly comprises a board comprising an electronic component and a connector mounted to the board and electrically connected to the electronic component. The connector is configured to receive an electronic card assembly, and the connector comprises an electrical contact and a friction contact. The electrical contact is configured to exert a first amount of force on the electronic card assembly when the electronic card assembly is fully seated in the connector. The friction contact is configured to exert a second amount of force on the electronic card assembly when the electronic card assembly is fully seated in the connector. The second amount of force is greater than the first amount of force.

According to an embodiment of the present disclosure, an electronic board assembly comprises a board comprising an electronic component and a connector mounted to the board and electrically connected to the electronic component. The connector is mounted to the board and electrically connected to the electronic component and is configured to receive an electronic card assembly. The connector comprises an electrical contact configured to contact a connection portion of the electronic card assembly when the electronic card assembly is fully seated in the connector. The connector also comprises a first finger configured to snap over a first shelf on the electronic card assembly when the electronic card assembly is being seated in the connector.

BRIEF DESCRIPTION OF THE DRAWINGS

FIG. 1 is a side view of an electronic component assembly, according to embodiments of the present disclosure.

FIG. 2A is a front view of an electronic card assembly seated in a connector; FIG. 2B is a cross-sectional view of the electronic card and the connector as indicated by line 2-2 in FIG. 2A; and FIG. 2C is a cross-sectional view of an alternative electronic card assembly and an alternative connector as indicated by line 2-2 in FIG. 2A, according to embodiments of the present disclosure.

FIG. 3 is a front view of an alternative electronic card assembly seated in an alternative connector, according to embodiments of the present disclosure.

FIG. 4A is a front view of an alternative electronic card assembly seated in an alternative connector; FIG. 4B is a cross-sectional view of the alternative electronic card and the alternative connector as indicated by line 4-4 in FIG. 4A; and FIG. 4C is a cross-sectional view of an alternative electronic card assembly and an alternative connector as indicated by line 4-4 in FIG. 4A, according to embodiments of the present disclosure.

FIG. 7 is a front view of an alternative electronic card assembly disengaged from an alternative connector, according to embodiments of the present disclosure.

FIG. 8A is a front view of an alternative electronic card assembly disengaged from an alternative connector; and FIG. 8B is a side view of the alternative electronic card assembly and the alternative connector, according to embodiments of the present disclosure.

DETAILED DESCRIPTION

Figure 5A:
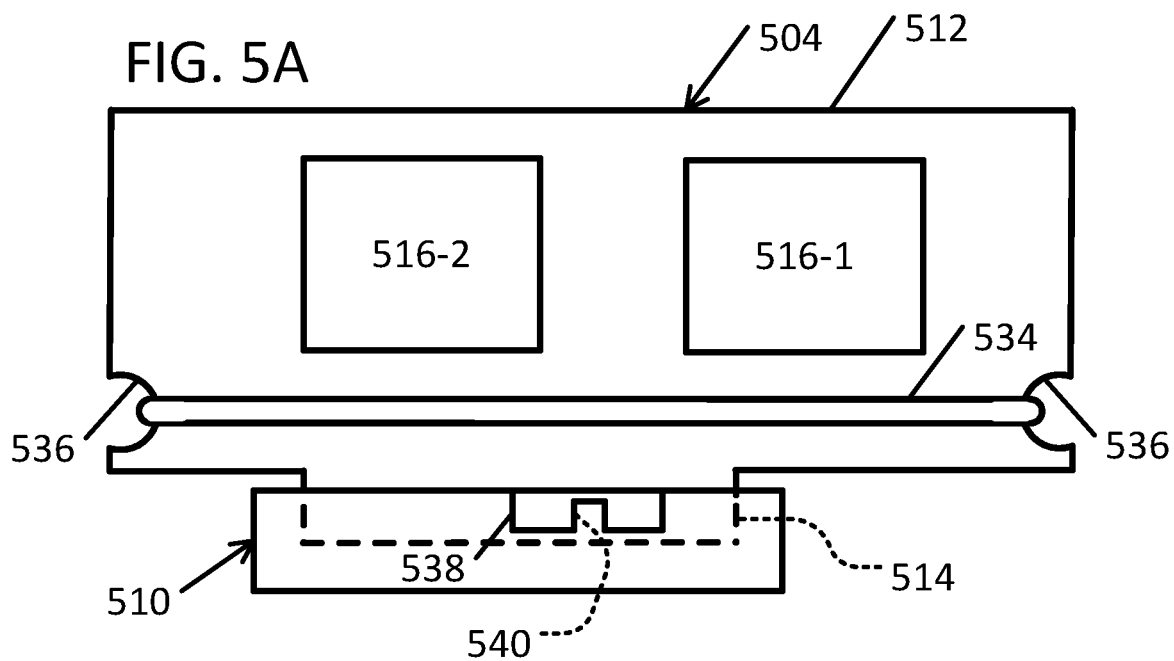
FIG. 5A is a front view of an alternative electronic card assembly seated in an alternative connector.

FIG. 1 is a side view of electronic component assembly 100. In the illustrated embodiment, electronic component assembly 100 comprises board 102 and electronic card assemblies 104-1, 104-2, 104-3, 104-4, 104-5, 104-6, and 104-7 (generically, "card 104" or collectively, "cards 104"). Board 102 comprises substrate 106 mounted to which are electronic component 108 and connectors 110 that are electrically connected to electronic component 108. Electronic component 108 can be any of a number of elements including, for example, a processor, memory, transmitter, resistor, capacitor, diode, connector, and/or wire leads.

In the illustrated embodiment, each card 104 (except for card 104-1) is seated in a connector 110 such that each card 104 extends perpendicularly to substrate 106. Card 104-1 is shown in a disengaged position (i.e., not positioned in its respective connector 110), although card 104-1 is oriented such that card 104-1 can be seated by moving it directly into its respective connector 110. Each card 104 comprises substrate 112 with connection portion 114, and electronic components 116 are mounted to substrate 112 and electrically connected to connection portion 114 (although only substrate 112-1, connection portion 114-1, and electronic components 116-1 and 116-2 are labeled in FIG. 1). Each card 104 can be a PCB that serves one or more functions, such as, for example, memory (e.g., DDIMM, M2 memory), power (e.g., pluggable voltage regulator module), input/ output (e.g., ethernet, universal serial bus), network (e.g., Wi-Fi®), and/or processing (e.g., computing, graphics). Because cards 104 can be connected, disconnected, and exchanged from board 102, the features, functions, and/or performance of electronic component assembly 100 can be altered at will in very short amounts of time without skilled labor.

FIG. 2A is a front view of electronic card assembly 204 ("card 204") seated in connector 210. FIG. 2B is a cross-sectional view of card 204 and connector 210 as indicated by line 2-2 in FIG. 2A. Card 204 can be similar to or the same as electronic card assembly 104-1, and connector 210 can be similar to or the same as connector 110 (both shown in FIG. 1).

In the illustrated embodiment, card 204 includes substrate 212, connection portion 214, and electrical components 216-1 and 216-2. Connection portion 214 further includes an array of pairs of electrical pads 220 and pairs of friction pads 222 that extend laterally parallel to each other, and, in this embodiment, connection portion 214 is no more than 80% of the length of the side of substrate 212 that it extends across. In some embodiments, connection portion 214 is no more than 50% of the length of the side of substrate 212 that it extends across. Connector 210 is generally U-shaped and includes an array of pairs of electrical contacts 224 and pairs of friction contacts 226 that extend laterally parallel to each other inside of connector 210. When card 204 is seated in connector 210, electrical contacts 224 contact electrical pads 220, respectively, and friction contacts 226 contact friction pads 222, respectively. Furthermore, when card 204 is disengaged from connector 210 (as shown by card 104-1 in FIG. 1), electrical contacts 224 and friction contacts 226 are separated from electrical pads 220 and friction pads 222.

When card 204 is disengaged from connector 210, electrical contacts 224 and friction contacts 226 are fixed and leaned inwards toward the center of connector 210. When card 204 is being inserted into connector 210, the wedge-shaped leading edge of connection portion 214 spreads apart each pair of electrical contacts 224 and each pair of friction contacts 226. The elastic deformation of electrical contacts 224 and friction contacts 226 exerts force on electrical pads 220 and friction pads 222, respectively. In some embodiments, the amount of force exerted on a friction pad 222 by a friction contact 226 can be at least 2.5 times the amount of force exerted on an electrical pad 220 by an electrical contact 224. In some embodiments, the amount of force exerted on a friction pad 222 by a friction contact 226 can be no greater than 10 times the force of the force exerted on an electrical pad 220 by an electrical contact 224. In some embodiments, the amount of force exerted on a friction pad 222 by a friction contact 226 can be at least 3 times the force of the force exerted on an electrical pad 220 by an electrical contact 224. In some embodiments, the amount of force exerted on a friction pad 222 by a friction contact 226 can be no greater than 6 times the force of the force exerted on an electrical pad 220 by an electrical contact 224.

Various materials can be used for the electrical pads 220, friction pads 222, electrical contacts 224, and friction contacts 226. For example, electrical pads 220 and/or electrical contacts 224 can be comprised of highly electrically conductive materials, such as gold. For another example, friction pads 222 and/or friction contacts 226 can be comprised of relatively higher friction materials, such as metals (e.g., nickel) or polymer (e.g., PCB substrate). Thereby, it can be difficult for card 204 to inadvertently or accidentally be removed from connector 210.

FIG. 2C is a cross-sectional view of alternative electronic card assembly 250 ("card 250") and alternative connector 252 as indicated by line 2-2 in FIG. 2A. Card 250 can be similar to or the same as card 204, and connector 252 can be similar to or the same as connector 210 (both shown in FIGS. 2A and 2B). However, there are differences. For example, friction contacts 254 are pinned to connector 252 such that they are rotatable, and they are biased inwards by biasing members 256 (e.g., springs).

In addition, there are no friction pads on card 250. In the illustrated embodiment, friction contacts 254 contact card substrate 258 directly. Effectively, the "friction pad" is made from PCB substrate material, such as, for example, FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), and CEM-5 (woven glass and polyester). Thereby, it can be difficult for card 250 to inadvertently or accidentally be removed from connector 252.

More generally, the presence of friction contacts 226, 254 in conjunction with friction pads 222 or substrate 258 provide a much greater frictional force to keep card 204, 250 seated in connector 210, 252, respectively. This occurs without requiring additional friction to be provided by electrical pads 220 and electrical contacts 224, which could cause premature wear thereon, potentially degrading conductivity and/or causing signal loss or noise.

While FIGS. 2A-2C show some embodiments of the present disclosure, alternative embodiments are possible as well. For example, there can be embodiments with only one side of card 204, 250 having electrical pads 220 and/or friction pads 222. In such embodiments, connector 210, 252 would only have one side of electrical contacts 224 and friction contacts 226 instead of having opposing pairs thereof. For another example, while there is an array of three evenly spaced pairs of electrical pads 220 shown, in other embodiments, there can be a greater or fewer number of electrical pads 220 and/or a different arrangement of electrical pads 220. In such embodiments, there would be a corresponding number and arrangement of electrical contacts 224. For another example, connector 210 can have closed ends like connector 110 (shown in FIG. 1).

FIG. 3 is a front view of alternative electronic card assembly 304 ("card 304") seated in alternative connector 310. Card 304 can be similar to or the same as card 104-1, and connector 310 can be similar to or the same as connector 110 (both shown in FIG. 1). In some respects, card 304 can be similar to or the same as card 204 and/or connector 310 can be similar to or the same as connector 210 (both shown in FIGS. 2A-2C). Therefore, the reference numerals in FIG. 3 can be 100 more than the reference numerals of corresponding features in FIG. 2, a feature which may apply to reference numerals in FIGS. 4A-8B as well.

In the illustrated embodiment, card 304 includes substrate 312, connection portion 314, and electrical components 316-1 and 316-2. Connection portion 314 further includes an array of electrical pads 320. Connector 310 includes an array of electrical contacts 324 and friction contacts 326 inside of connector 310. When card 304 is seated in connector 310, electrical contacts 324 and friction contacts 326 contact electrical pads 320, respectively. Furthermore, when card 304 is disengaged from connector 310 (as shown by card 104-1 in FIG. 1), electrical contacts 324 and friction contacts 326 are separated from electrical pads 320.

As card 304 is being seated and when card 304 is fully seated in connector 310, elastic deformation of electrical contacts 324 and friction contacts 326 exerts force on electrical pads 320, respectively. In some embodiments, the amount of force exerted on an electrical pad 320 by a friction contact 326 can be at least 2.5 times the amount of force exerted on an electrical pad 320 by an electrical contact 324. In some embodiments, the amount of force exerted on an electrical pad 320 by a friction contact 326 can be no greater than 10 times the force of the force exerted on an electrical pad 320 by an electrical contact 324. In some embodiments, the amount of force exerted on an electrical pad 320 by a friction contact 326 can be at least 3 times the force of the force exerted on an electrical pad 320 by an electrical contact 324. In some embodiments, the amount of force exerted on an electrical pad 320 by a friction contact 326 can be no greater than 6 times the force of the force exerted on an electrical pad 320 by an electrical contact 324.

To contrast card 304 and connector 310 with card 204 and connector 210 (shown in FIG. 2), card 304 does not include separate friction pads, such as friction pads 222. Instead, friction contacts 326 contact and exert force against the non-electrically connected members of the array of electrical pads 320. In the illustrated embodiment, the specific electrical pads 320 being referred to are the leftmost and rightmost ones, which are not connected to electronic component 316-1 by an electrical lead 328 (as the center three electrical pads 320 are). In other words, the array of electrical pads 320 has positions that are used for electrical connections to connector 310 and other positions that are used as friction contacts with connector 310. However, friction pads 222 of card 204 are located outside of positions where electrical pads 320 would otherwise be (i.e., friction pads 222 are not properly in the array of electrical pads 320).

Various materials can be used for the electrical pads 320, electrical contacts 324, and friction contacts 326. For example, electrical pads 320 and/or electrical contacts 324 can be comprised of highly electrically conductive materials, such as gold. For another example, the electrical pads 320 corresponding to friction contacts 326 and/or friction contacts 326 can be comprised of relatively higher friction materials, such as metals (e.g., nickel) or polymer (e.g., PCB substrate). For yet another example, the non-electrically connected electrical pads 320 (corresponding to friction contacts 326) are comprised of the same material as the electrically connected electrical pads 320 (corresponding to electrical contacts 324) so that they can all be manufactured during the same process. In such embodiments, the non-electrically connected electrical pads 320 can be made thicker than the electrically connected electrical pads 320.

More generally, the presence of friction contacts 326 in conjunction with their corresponding electrical pads 320 provide a much greater frictional force to keep card 304 seated in connector 310. Thereby, it can be difficult for card 304 to inadvertently or accidentally be removed from connector 310. This occurs without requiring additional friction to be provided by electrical pads 320 and electrical contacts 324, which could cause premature wear thereon, potentially degrading conductivity and/or causing signal loss or noise.

While FIG. 3 shows some embodiments of the present disclosure, alternative embodiments are possible as well. For example, there can be embodiments with both sides of card 304 having electrical pads 320. In such embodiments, connector 310 would have pairs of electrical contacts 324 and friction contacts 326, similar to or the same as card 204 and connector 210 (shown in FIG. 2B). For another example, other patterns of the array of electrical pads 320 are possible, such that the respective spacing can be different and/or non-uniform, and/or the positions of which electrical pads 320 are electrically connected and which ones are not can also be different.

FIG. 4A is a front view of alternative electronic card assembly ("card 404") seated in alternative connector 410. FIG. 4B is a cross-sectional view of card 404 and connector 410 as indicated by line 4-4 in FIG. 4A. Card 404 can be similar to or the same as card 104-1, and connector 410 can be similar to or the same as connector 110 (both shown in FIG. 1).

In the illustrated embodiment, card 404 includes substrate 412, connection portion 414, and electrical components 416-1 and 416-2. Connection portion 414 further includes an array of electrical pads 420 and shelves 430. Connector 410 includes an array of electrical contacts 424 and fingers 432 inside of connector 410. When card 304 is seated in connector 410, electrical contacts 424 contact electrical pads 420, respectively. Furthermore, when card 404 is disengaged from connector 410 (as shown by card 104-1 in FIG. 1), electrical contacts 424 are separated from electrical pads 420.

As card 404 is moved from a disengaged position to being seated in connector 410, the leading edge of connection portion 414 elastically spreads apart each pair of electrical contacts 424, and shelves 430 elastically spread apart fingers 432. As card 404 is being finally seated in connected 410, the inner ends of fingers 432 snap over shelves 430, respectively. In this configuration, fingers 432 may or may not be in contact with substrate 412. Regardless, withdrawing card 404 from connector 410 is made significantly difficult due to the tops of shelves 430 being perpendicular (or at a slight angle) with respect to the bottoms of fingers 432 (which is in contrast to the bottom surfaces of shelves 430 that are at substantial angles from the tops of fingers 432).

To contrast card 304 and connector 310 with card 304 and connector 310 (shown in FIG. 3), connector 410 does not include friction contacts, such as friction contacts 326. While fingers 432 contact shelves 430 during seating of card 304 (causing more friction than electrical contacts 424 do), connector 410 does not contact card 404 in the region of the array of electrical pads 420 when card 404 is fully seated. Instead, contact can be on shelves 430 and/or on substrate 412 above the region where electrical pads 420 are located. In some embodiments, fingers 432 do not contact shelves 430 when card 404 is fully seated. In such embodiments, fingers 432 would contact shelves 430 if card 404 was withdrawn a small amount, which prevents card 404 from being disengaged from connector 310.

Various materials can be used for the electrical pads 420, electrical contacts 424, and fingers 432. For example, electrical pads 420 and/or electrical contacts 424 can be comprised of highly electrically conductive materials, such as gold. For another example, fingers 432 can be comprised of relatively higher friction materials, such as metals (e.g., nickel) or polymer (e.g., PCB substrate) and/or fingers 432 can be plated, for example, with gold and/or copper.

FIG. 4C is a cross-sectional view of alternative electronic card assembly 450 ("card 450") and alternative connector 452 as indicated by line 4-4 in FIG. 4A. Card 450 can be similar to or the same as card 404, and connector 452 can be similar to or the same as connector 410 (both shown in FIGS. 4A and 4B). However, there are differences. For example, shelves 460 extend into the array of electrical contacts 420, in between the individual electrical contacts 420. For another example, card 404 can include divots 464 into which fingers 462 are positioned when card 450 is seated in connector 452.

More generally, fingers 432, 462 are anchoring features that are configured to engage with shelves 430, 460 and/or divots 464 which are securing features. Thereby, shelves 430, 460, fingers 432, 462, and divots 464 provide a geometric impediment that can keep cards 404, 450 seated in connectors 410, 452, respectively. Thereby, it can be difficult for cards 404, 450 to inadvertently or accidentally be removed from connectors 410, 452, respectively. This occurs without requiring additional friction to be provided by electrical pads 420 and electrical contacts 424, which could cause premature wear thereon, potentially degrading conductivity and/or causing signal loss or noise. Furthermore, shelves 460 prevent fingers 462 from dragging on electrical contacts 424, preventing unnecessary wear thereof.

While FIGS. 4A-4C show some embodiments of the present disclosure, alternative embodiments are possible as well. For example, there can be embodiments with only one shelf 430, 460. In such embodiments, connector 410, 452 would only have one finger 432, 462 and one divot 464 instead of having opposing pairs thereof.

Figure 5B:
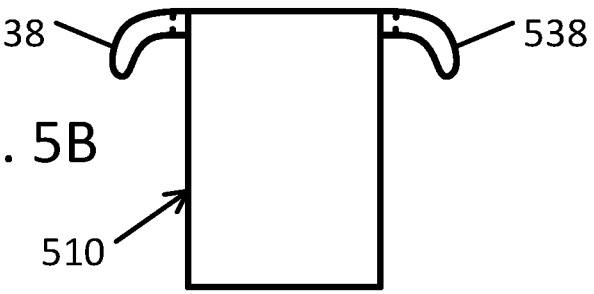
FIG. 5B is a side view of the alternative connector.
Figure 5C:
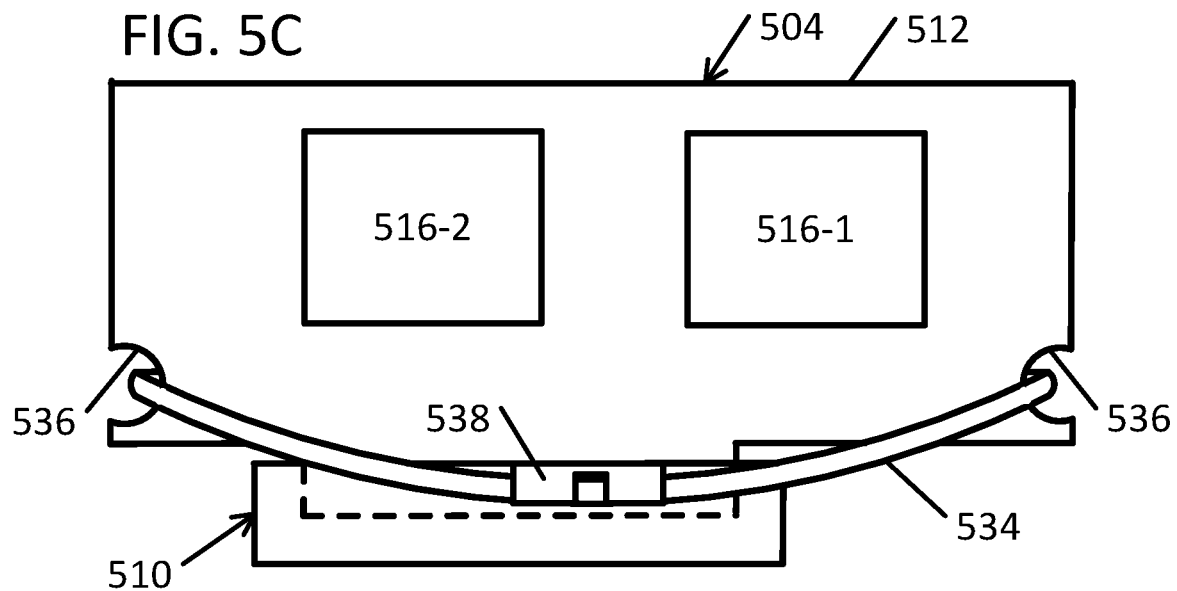
FIG. 5C is a front view of the alternative electronic card assembly seated and secured in the alternative connector, according to embodiments of the present disclosure.

FIG. 5A is a front view of alternative electronic card assembly 504 ("card 504") seated in alternative connector 510. FIG. 5B is a side view of connector 510. FIG. 5C is a front view of card 504 seated and secured in connector 510. Card 504 can be similar to or the same as card 104-1, and connector 510 can be similar to or the same as connector 110 (both shown in FIG. 1).

In the illustrated embodiment, card 504 includes substrate 512, connection portion 514, electrical components 516-1 and 516-2, and band 534. Band 534 is a movable member that serves as a securing feature that is comprised of an elastomeric material. Band 534 rests in notches 536 in the sides of substrate 512 which prevent band 534 from sliding up or down card 504. In addition, connector 510 includes hooks 538 that extend forward and backward from the exterior of connector 510 and are configured to hold band 534 to secure card 504 in connector 510, thus serving as anchoring features. Hooks 538 can have interruptions 540 which are gaps in hooks 538, for example, that allow a claw tool (not shown) to be used to pull band 534 down from its rested position (shown in FIG. 5A) to its secured position (shown in FIG. 5C). Thereby, card 504 can be secured to connector 510 such that it can be difficult for card 504 to inadvertently or accidentally be removed from connector 510.

Figure 6B:
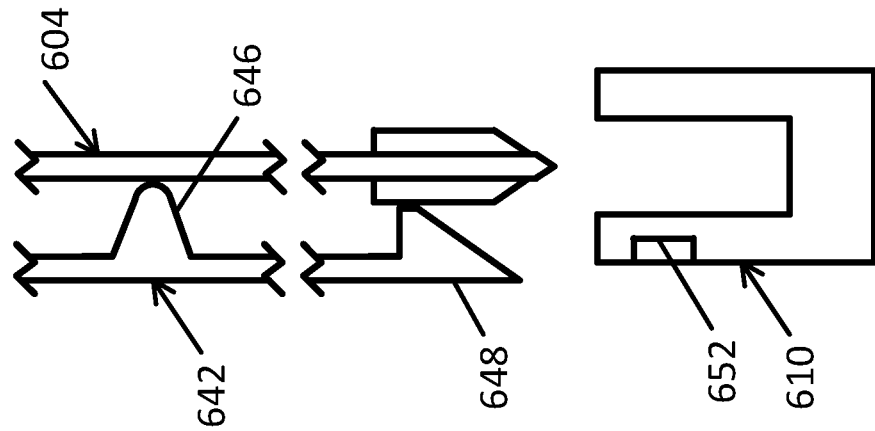
FIG. 6B is a cross-sectional view of the alternative electronic card and the alternative connector as indicated by line 6-6 in FIG. 6A.
Figure 6A:
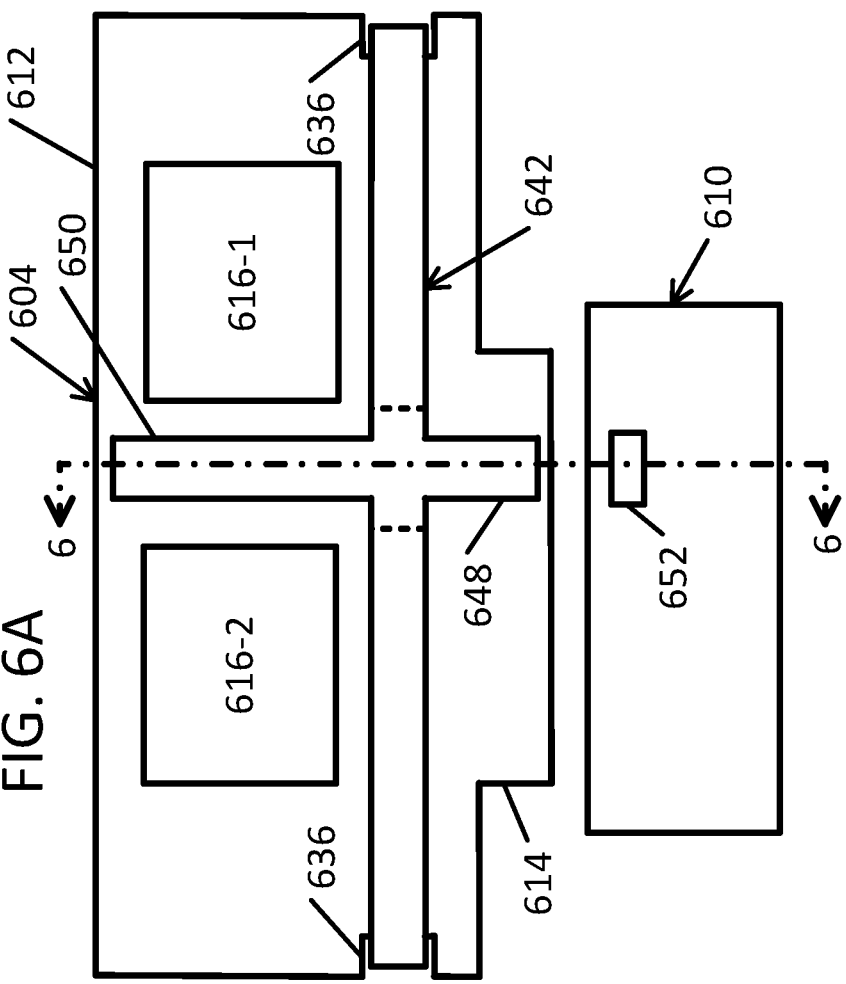
FIG. 6A is a front view of an alternative electronic card assembly disengaged from an alternative connector.
Figure 6C:
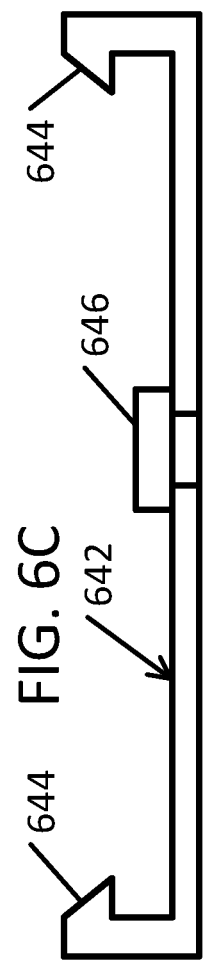
FIG. 6C is a top view of a latch, according to embodiments of the present disclosure.

FIG. 6A is a front view of alternative electronic card assembly 604 ("card 604") disengaged from alternative connector 610. FIG. 6B is a cross-sectional view of card 604 and connector 610 as indicated by line 6-6 in FIG. 6A. FIG. 6C is a top view of latch 642. Card 604 can be similar to or the same as card 104-1, and connector 610 can be similar to or the same as connector 110 (both shown in FIG. 1).

In the illustrated embodiment, card 604 includes substrate 612, connection portion 614, electrical components 616-1 and 616-2, and latch 642. Latch 642 is a securing feature that is connected to substrate 612 at notches 636 and is comprised of a substantially elastically deformable material, such as polymer or metal, such that latch 642 can be a movable member. Latch 642 includes claws 644, fulcrum 646, hook 648, and tab 650. Claws 644 clip around the sides of substrate 612 at notches 636 so that latch 642 does not extend laterally beyond the boundaries of card 604. Fulcrum 646 also contacts substrate 612 on an area thereof where there is an absence of electrical components 616 and provides a pivot for hook 648 and tab 650.

In the illustrated embodiment, hook 648 is configured to engage depression 652, which is an anchoring feature in the exterior of connector 610, in connector 610 when card 604 is seated in connector 610. If a user desires to disengage card 604, the user can depress tab 650 (i.e., move tab 650 toward substrate 612) which flexes catch 642 such that hook 648 is pivoted out of depression 652 about fulcrum 646. Thereby, latch 642 is a lever that can secure card 604 to connector 610 such that it can be difficult for card 604 to inadvertently or accidentally be removed from connector 610.

While FIGS. 6A-6C show some embodiments of the present disclosure, alternative embodiments are possible as well. For example, latch 642 can be a two-piece assembly instead of a monolithic component. In such embodiments, hook 648 and tab 650 can be on one piece that is rotatably connected (e.g., pinned) to the other piece which would include claws 644 and fulcrum 646.

FIG. 7 is a front view of alternative electronic card assembly 704 ("card 704") disengaged from alternative connector 710. Card 704 can be similar to or the same as card 104-1, and connector 710 can be similar to or the same as connector 110 (both shown in FIG. 1).

In the illustrated embodiment, card 704 includes substrate 712, connection portion 714, and electrical components 716-1 and 716-2. Unlike the previously depicted cards, card 704 includes wings 754 which are portions of substrate 712 alongside connection portion 714 that provide additional space for mounting electrical components 716-3 and 716-4. This can increase the capability and/or performance of electronic component assembly 100 (shown in FIG. 1) without increasing its physical size.

Wings 754 include tabs 756 which are securing features that extend from wings 754 and are engaged by movable detents 758, respectively, which are anchoring features on the exterior of connector 710, as card 704 is inserted into connector 710 and seated therein. More specifically, tabs 756 contact the angled faces of detents 758, respectively, to initially move detents 758 inwards, in opposite directions, towards each other. After sufficient insertion of card 704, springs 760 urge detents 758 to move outwards, in opposite directions, away from each other. When card 704 is fully seated, detents 758 may still be in contact with tabs 756 to secure card 704 to connector 710 such that it can be difficult for card 704 to inadvertently or accidentally be removed from connector 710.

FIG. 8A is a front view of alternative electronic card assembly 804 ("card 804") disengaged from alternative connector 810. FIG. 8B is a side view of card 804 and connector 810. Card 804 can be similar to or the same as card 104-1, and connector 810 can be similar to or the same as connector 110 (both shown in FIG. 1).

In the illustrated embodiment, card 804 includes substrate 812, connection portion 814, and electrical components 816-1, 816-2, 816-3, and 816-4. Unlike some of the previously depicted cards, card 804 includes wings 854 which are portions of substrate 812 alongside connection portion 814 that provide additional space for mounting electrical components 816-3 and 816-4. This can increase the capability and/or performance of electronic component assembly 100 (shown in FIG. 1) without increasing its physical size.

Wings 854 include tabs 856 which are securing features that extend from wings 854 and are engaged by pincers 862, respectively, which are anchoring features on the exterior of connector 810, as card 804 is inserted into connector 810 and seated therein. More specifically, tabs 856 contact fingers 864, respectively, to initially move fingers 864 outwards, in opposite directions, away from each other, respectively. After sufficient insertion of card 804, the elastic deformation of pincers 862 urge fingers 864 to move inwards, in opposite directions, towards each other, respectively. When card 804 is fully seated, pincers 862 may still be in contact with tabs 856 to secure card 804 to connector 810 such that it can be difficult for card 804 to inadvertently or accidentally be removed from connector 810.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electronic board assembly comprising:
a board comprising an electronic component; and
a connector mounted to the board and electrically connected to the electronic component,
 the connector configured to receive an electronic card assembly, the connector comprising:
 an electrical contact that is electrically connected to the electronic component and is configured to exert a first amount of force on the electronic card assembly when the electronic card assembly is being seated in the connector; and
 a friction contact that is not electrically connected to the electronic component and is configured to exert a second amount of force on the electronic card assembly when the electronic card assembly is being seated in the connector;
 wherein the second amount of force is greater than the first amount of force;
 wherein the electronic card assembly includes a friction surface plated on to a substrate material of the electronic card assembly to increase a coefficient of friction between the electronic card assembly and the friction contact.

2. The electronic board assembly of claim 1, wherein the electronic card assembly includes a connection portion that is no longer than 80% of a length of a side on which the connection portion is located.

3. The electronic board assembly of claim 1, wherein the friction contact exerts the second amount of force on the electronic card assembly when the electronic card assembly is fully seated in the connector.

4. The electronic board assembly of claim 3, wherein the second amount of force is 2.5 times greater than the first amount of force and is no more than 10 times greater than the first amount of force.

5. The electronic board assembly assembly of claim 1, wherein the friction contact is positioned inside of the connector.

6. The electronic board assembly of claim 1, wherein the electronic card assembly is selected from the group consisting of: a memory card, a power card, an input/output card, a network card, and a processing card.

7. The electronic board assembly of claim 1, wherein the friction contact is laterally spaced apart from the electrical contact.

8. An electronic board assembly comprising:
a board comprising an electronic component; and
a connector mounted to the board and electrically connected to the electronic component,
 the connector configured to receive an electronic card assembly, the connector comprising:
 an electrical contact that is electrically connected to the electronic component and is configured to exert a first amount of force on the electronic card assembly when the electronic card assembly is fully seated in the connector; and
 a friction contact that is not electrically connected to the electronic component and is configured to exert a second amount of force on the electronic card assembly when the electronic card assembly is fully seated in the connector;
 wherein the second amount of force is greater than the first amount of force; and
 wherein the electronic card assembly includes a friction surface plated on to a substrate material of the electronic card assembly to increase a coefficient of friction between the electronic card assembly and the friction contact.

9. The electronic board assembly of claim 8, wherein the electronic card assembly includes a connection portion that is no longer than 80% of a length of a side on which the connection portion is located.

10. The electronic board assembly of claim 8, wherein the second amount of force is 2.5 times greater than the first amount of force and is no more than 10 times greater than the first amount of force.

11. The electronic board assembly of claim 8, wherein the friction contact extends parallel to the electrical contact.

12. The electronic board assembly of claim 8, wherein the friction contact is in an array of electrical contacts of which the electrical contact is one.

13. The electronic board assembly of claim 8, wherein the friction contact contacts the electronic card assembly at a location that is laterally outside of a position in an array of electrical contacts of which the electrical contact is one.

14. The electronic board assembly of claim 8 wherein the electronic card assembly is selected from the group consisting of: a memory card, a power card, an input/output card, a network card, and a processing card.

15. The electronic board assembly of claim 8, wherein the friction contact is laterally spaced apart from the electrical contact.

16. An electronic board assembly comprising:
a board comprising an electronic component; and
a connector mounted to the board and electrically connected to the electronic component,
 the connector configured to receive an electronic card assembly, the connector comprising:
 an electrical contact that is electrically connected to the electronic component and is configured to exert a first amount of force on the electronic card assembly when the electronic card assembly is being seated in the connector; and
 a friction contact that is not electrically connected to the electronic component and is configured to exert a second amount of force on the electronic card assembly when the electronic card assembly is being seated in the connector;
 wherein the friction contact is laterally spaced apart from the electrical contact along a same side of the connector in a direction that extends across a length of the connector;

wherein the electronic card assembly includes a friction surface plated on to a substrate material of the electronic card assembly to increase a coefficient of friction between the electronic card assembly and the friction contact.

17. The electronic board assembly of claim 16, wherein the friction contact is taller than the electrical contact.

18. The electronic board assembly of claim 16, wherein the electronic card assembly includes a connection portion that is no longer than 80% of a length of a side of the electronic card assembly on which the connection portion is located.

19. The electronic board assembly of claim 16, wherein:
the electrical contact is one of a plurality of electrical contacts;
the friction contact is one of a plurality of friction contacts; and
the friction contacts and the electrical contacts alternate across the connector.

* * * * *